United States Patent [19]

Forney, Jr. et al.

[11] 4,441,781
[45] Apr. 10, 1984

[54] PHASE-MATCHED SEMIRIGID COAXIAL CABLE AND METHOD FOR TERMINATING THE SAME

[75] Inventors: Edgar W. Forney, Jr., Harrisburg; Richard S. Hogendobler, Camp Hill, both of Pa.

[73] Assignee: AMP Incorporated, Harrisburg, Pa.

[21] Appl. No.: 408,958

[22] Filed: Aug. 17, 1982

[51] Int. Cl.³ .......................................... H01R 17/18
[52] U.S. Cl. ................................. 339/177 R; 29/705; 29/593
[58] Field of Search ........... 339/177; 324/58 R, 58 A, 324/84; 29/593, 863, 705

[56] References Cited

U.S. PATENT DOCUMENTS

| | | | |
|---|---|---|---|
| 2,302,143 | 11/1942 | Pickles | 324/84 |
| 2,677,807 | 5/1954 | Byrne | 324/84 |
| 3,201,721 | 8/1965 | Voelcker | 333/33 |
| 3,282,805 | 11/1966 | Brown | 29/593 |
| 3,287,672 | 11/1966 | Heinz | 29/593 |
| 3,452,429 | 7/1969 | Liebscher | 29/593 |
| 3,525,057 | 8/1970 | Beeson | 339/177 R |
| 3,663,901 | 5/1972 | Forney | 339/177 R |
| 3,711,942 | 1/1973 | Reynolds | 29/593 |
| 3,757,272 | 9/1973 | Laramee et al. | 339/17 M |
| 3,761,844 | 9/1973 | Reeder | 339/177 R |
| 3,825,861 | 7/1974 | O'Donnell | 333/33 |
| 4,115,749 | 9/1978 | Cole et al. | 333/31 R |

*Primary Examiner*—Joseph H. McGlynn
*Assistant Examiner*—David L. Pirlot
*Attorney, Agent, or Firm*—Adrian J. LaRue

[57] ABSTRACT

A method is disclosed for terminating semirigid coaxial cable that is phase matched which is accomplished by cutting a length of coaxial cable to the exact or approximate desired electrical length. A coaxial connector is permanently terminated onto one end of the cable and a phase-matching test connector is positioned onto the other end of the cable. The cable is tested to determine if the electrical length of the cable is correct. If it is, the test connector is removed and another coaxial connector is permanently terminated onto the other end of the cable. If the electrical length of the cable is too long, the test connector is removed, the cable is trimmed to the correct length, the test connector is reapplied onto the cable, the cable is retested, and if now correct, the other coaxial connector is permanently terminated onto the cable.

4 Claims, 9 Drawing Figures

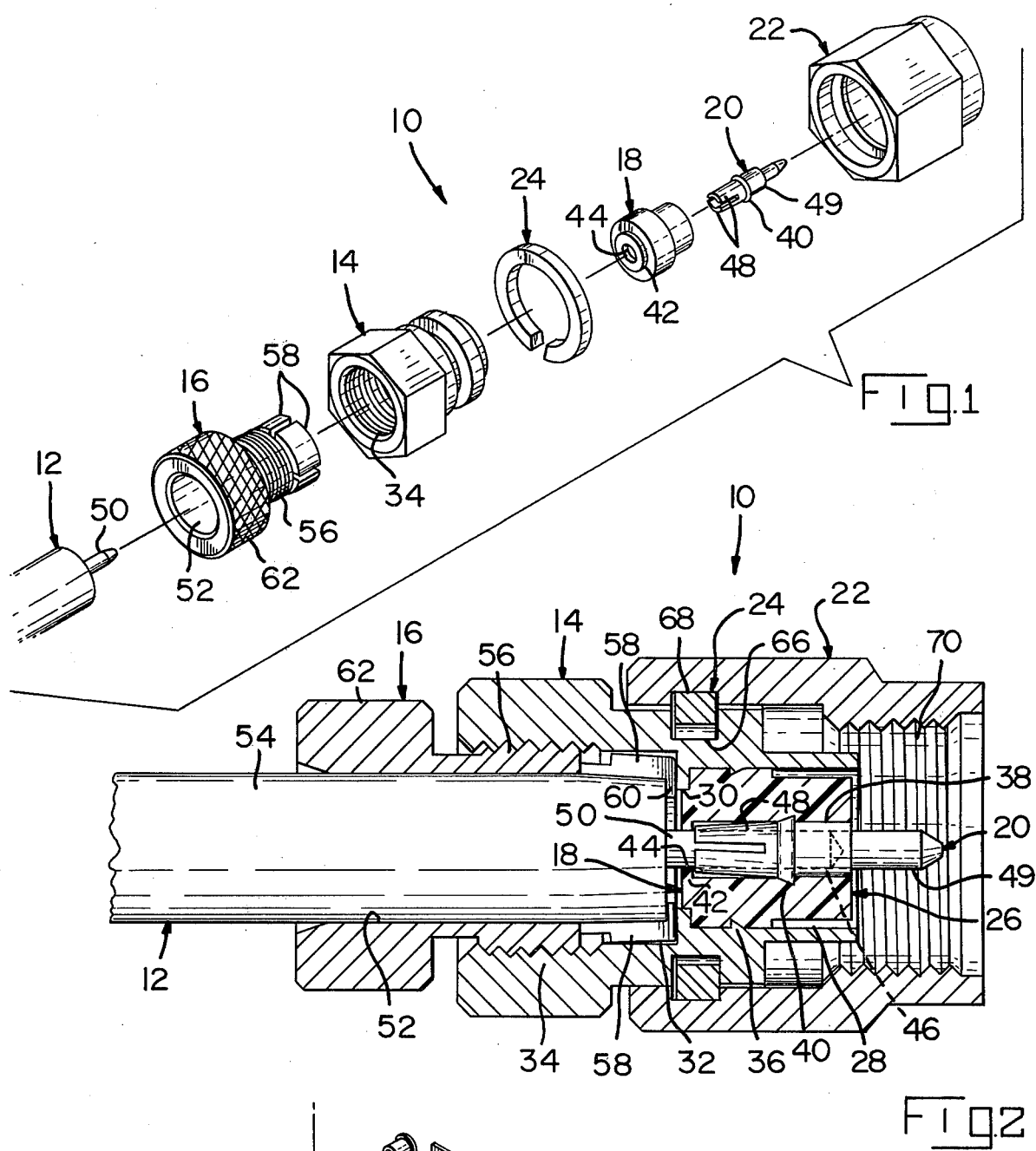
Fig.1
Fig.2
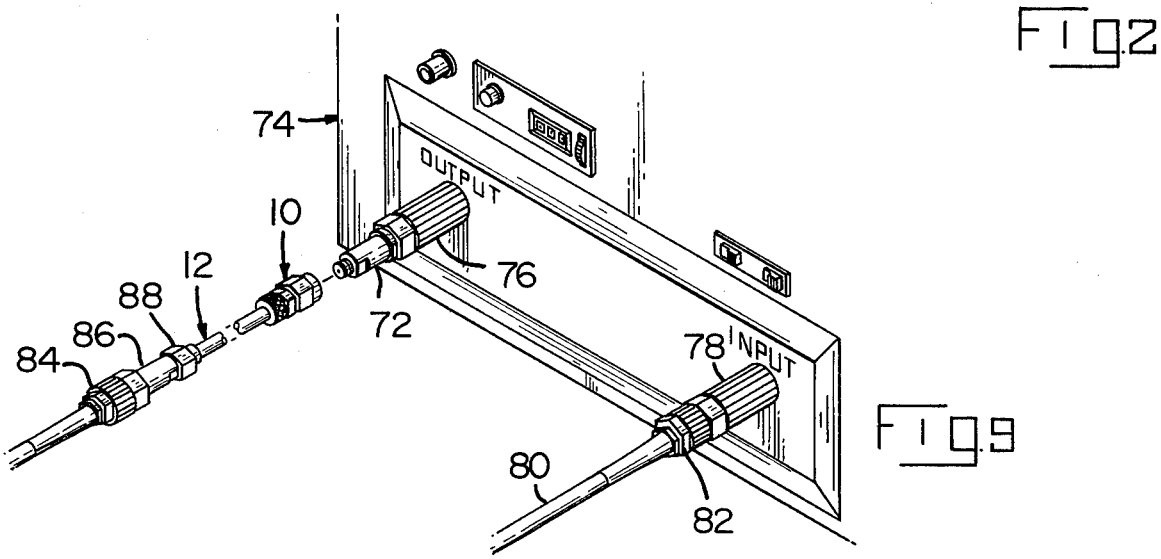
Fig.9

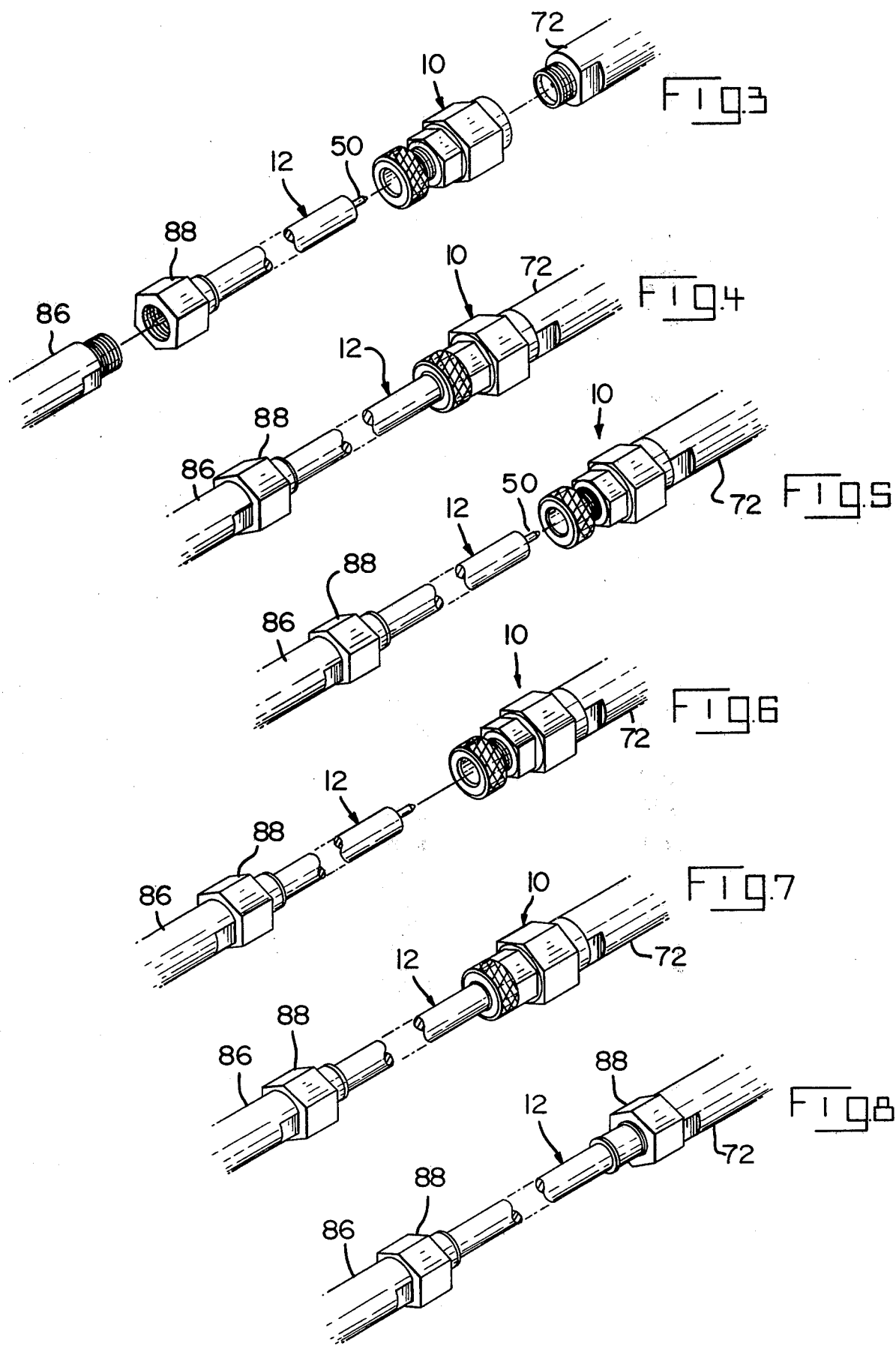

4,441,781

PHASE-MATCHED SEMIRIGID COAXIAL CABLE AND METHOD FOR TERMINATING THE SAME

This invention relates to a method for terminating semirigid coaxial cable and more particulary to a method for terminating semirigid coaxial cable that is phase matched.

BACKGROUND OF THE INVENTION

In many high frequency applications such as for example phased array radar, RF performance is extremely important. Many coaxial cable lines are used in the high frequency equipment for such applications. It is highly important that the electrical lenghts of these coaxial cable lines be precise so that phase shift of the signal is held to a tight tolerance.

The usual procedure in the prior art for preparing the coaxial cable lines for high frequency applications is to secure coaxial connectors as by soldering onto the ends of the coaxial cable lines, then test them for electrical length. In most cases, the coaxial cable lines would have to be trimmed to obtain the desired electrical length. To do this, one of the coaxial connectors would have to be removed from the coaxial cable line, the end of the cable trimmed, and the connector resecured in place. Hopefully, proper trimming of the cable end was done, otherwise, the operation had to be repeated. If too much cable was trimmed, the cable was discarded. Such practice is time consuming and can result in discarded cable.

SUMMARY OF THE INVENTION

According to the present invention, a method is disclosed for terminating semirigid coaxial cable that is phase matched which is accomplished by cutting a length of coaxial cable to the exact or approximate desired electrical length. A coaxial connector is permanently terminated onto one end of the cable and a phase-matching test connector is positioned onto the other end of the cable. The cable is tested to determine if the electrial length of the cable is correct. If it is, the test connector is removed and another coaxial connector is permanently terminated onto the other end of the cable. If the electrical length of the cable is too long, the test connector is removed, the cable is trimmed to the correct length, the test connector is reapplied onto the cable, the cable is retested, and if now correct, the other coaxial connector is permanently terminated onto the cable.

BRIEF DESCRIPTION OF THE DRAWINGS

FIG. 1 is a perspective exploded view of the elements of a phase-matching coaxial test connector.

FIG. 2 is a cross-sectional view of the connector of FIG. 1 applied onto an end of a semirigid coaxial cable.

FIGS. 3-8 illustrate the various steps to permanently terminate an end of a length of cable, position a test connector on the other end of the cable, test the cable, trim the cable, retest the cable, and permanently terminate the cable.

FIG. 9 shows how the cable is tested.

DETAILED DESCRIPTION OF THE INVENTION

FIG. 1 shows the elements of the phase-matching coaxial test connector which is to be fitted onto the stripped end of a semirigid coaxial cable. Test connector 10 includes a front shell 14, a rear shell 16, a dielectric insert 18, a center contact 20, a coupling 22, and a locking ring 24.

Front shell 14 had a bore 26 extending therethrough including a front section 28, a center section 30, and a rear section 32. Threads 34 are disposed along rear section 32. Front section 28 of bore 26 has an annular projection 36 with the leading surface thereof being beveled.

Dielectric insert 18 has a bore 38 extending therethrough in which center contact 20 is secured into position therein by means of annular barb 40. With center contact 20 secured in bore 38 of dielectric insert 18, this assembly is secured in front section 28 of bore 26 with annular projection 36 securing dielectric insert 18 in position therein. A annular section 42 of dielectric insert 18 is positioned within center section 30 of bore 26 and includes an opening 44 in axial alignment with bore 46 which is adapted to receive center conductor 50 of semirigid coaxial cable 12 with spring contact members 48 making the electrical connection therewith. A pin contact 49 of center contact 20 extends outwardly from insert 18.

Rear shell 16 has bore 52 to receive outer conductor 54 of coaxial cable 12 and a section 56 is threadably matable with threads 34 of front shell 14 to secure rear shell 16 in positon in front shell 14. Spring contact members 58 of arcuate configuration have arcuate-shaped projections 60 against which the end of outer conductor 54 abuts when coaxial cable 12 is positioned within bore 52 as illustrated in FIG. 2. Spring contact members 58 springably engage outer conductor 54 and spring contact members 48 springably engage conductor 50. Rear shell 16 has a knurled surface 62 for engagement by an operator to enable rear shell 16 to be threadably moved along threads 34 of front shell 14 until arcuate projections 60 butt against the inner end of rear section of bore 26 of front shell 14. This structure provides the same electrical length that the coaxial connector has that is to be permanently terminated onto coaxial cable 12.

Locking ring 24 has a C-shape configuration that mates with annular recess 66 in the exterior surface of front shell 14 and annular recess 68 on the internal surface of coupling member 22 to maintain coupling member 22 in position on front shell 14 for freely rotatable movement relative thereto. Coupling member 22 also includes internal threads 70 for securing test connector 10 onto a precision adaptor 72 as part of an automatic network analyzer shown in FIG. 9. Automatic network analyzer 74 is manufactured by Hewlett-Packard Corporation and is used for phase angle measurement of the cable to be terminated so that the accuracy of the electrical length of the cable to be terminated is precise prior to permanently terminating another coaxial connector onto the other end of the cable.

To measure the phase angle of the length of cable to be terminated, automatic network analyzer 74 includes an output port and an input port. The output port has connected thereto a 7 millimeter precision connector 76 to which is connected precision adaptor 72, also having a 7 millimeter precision connector 76. The input port also has connected thereto a 7 millimeter precision connector 78. A coaxial cable jumper 80 having coaxial connectors 82 and 84 terminating the ends thereof is connected to input connector 78 and precision adaptor 86 of identical construction as that of precision adaptor 72.

To measure the phase angle of a length of semirigid coaxial cable 12 to be tested and then to be permanently terminated, the following procedure is utilized. A length of semirigid coaxial cable 12 is cut to the length that is required. Cable 12 can be stright or curved as required. If cable 12 has not been cut to the correct length, it must have a longer length so that it can be trimmed to the correct length if necessary.

After cable 12 has been cut to the desired length and the ends prepared for termination, coaxial connector 88 of the type disclosed in U.S. patent application Ser. No. 222,188 filed Jan. 2, 1981, is permanently terminated on one end of cable 12 and then test connector 10 is positioned onto the other end of cable 12 with center conductor 50 electrically connected with spring contact members 48 of center contact 20 and outer conductor 54 electrically connected with spring contact members 58 representing the outer contact of connector 10 shown in FIG. 2. The electrical length of test connector 10 is identical to the electrical length of coaxial connector 88.

Test connector 10 is connected to precision adaptor 72 while connector 88 is connected to precision adaptor 86. As shown in FIGS. 3, 4, and 9, terminated cable 12 is now connected to automatic network analyzer 74 so that the test signal from the output port is transmitted through the cable to be tested and received at the input port of the automatic network analyzer to determine the electrical length of cable 12.

If the electrical length of cable 12 is correct, then another coaxial connector 88 identical to coaxial connector 88 is permanently terminated onto the other end of cable 12. The terminated cable can once again be tested to make certain that the cable length is correct. The cable is ready for use. If cable 12 is slightly too long, cable 12 is removed from test connector 10, the end of the cable is trimmed to the correct electrical length by means of a trimming tool disclosed in U.S. patent application Ser. No. 408,959, filed Aug. 17, 1982 (Docket No. 9797) whereafter cable 12 is reconnected to test connector 10 and the electrical length of the trimmed cable is once again determined by automatic network analyzer 74. If the electrical length of cable 12 is now correct, cable 12 is removed from test connector 10 and coaxial connector 88 is permanently terminated onto trimmed cable 12 whereafter the electrical length of permanently terminated cable 12 is measured to make certain that the electrical length is as it should be.

In accordance with the present invention, the electrical lengths of coaxial cables can be correctly determined prior to permanently terminating the coaxial cables so that coaxial cables of accurate electrical lengths can be used in electronic equipment requiring the use of coaxial cables with precise electrical lengths.

While the present invention has been described in conjunction with the use of semirigid coaxial cable, it is to be understood that the present invention can be used in conjunction with other types of coaxial cable which are to be used in equipment in which electrical lengths of the coaxial cables is an important factor.

We claim:

1. A method for terminating a length of coaxial cable to a selected electrical length comprising the steps of:
    cutting the coaxial cable to the selected electrical length;
    permanently terminating one end of the coaxial cable with a coaxial connector;
    positioning a phase-matching test connector onto the other end of the coaxial cable;
    measuring the phase angle of the coaxial cable to determine the electrical length of the coaxial cable;
    removing the test connector from the coaxial cable, and if the electrical length of the coaxial cable is correct, permanently terminating the other end of the coaxial cable with another coaxial connector;
    or, if the electrical length is not correct, removing the test connector from the coaxial cable, trimming the other end of the coaxial cable to the correct electrical length, positioning the test connector onto the trimmed end, measuring the phase angle of the trimmed coaxial cable to make certain the electrical length is correct, removing the test connector from the coaxial cable, and permanently terminating the other end of the coaxial cable with another coaxial connector.

2. a method as set forth in claim 1 comprising the further step of measuring the permanently terminated cable to make certain that the electrical length is correct.

3. A length of terminated coaxial cable having a predetermined electrical length, comprising:
    coaxial connector means permanently terminated onto one end of the coaxial cable;
    phase-matching test coaxial connector means removably fitted onto the other end of the coaxial cable enabling the cable to be measured to determine the electrical length thereof; and
    other coaxial connector means permanently terminated onto the other end of the coaxial cable in place of said phase-matching test coaxial connector means if the electrical length of the cable is correct.

4. A length of terminated coaxial cable as set forth in claim 3 wherein said other end of said coaxial cable is trimmed to the correct length whereafter said other coaxial connector means is permanently terminated thereon.

* * * * *